(12) United States Patent
Choi et al.

(10) Patent No.: US 7,960,251 B2
(45) Date of Patent: Jun. 14, 2011

(54) METHOD FOR PRODUCING NANOWIRES USING A POROUS TEMPLATE

(75) Inventors: Byoung Lyong Choi, Seoul (KR); Jong Min Kim, Suwon-Si (KR); Eun Kyung Lee, Suwon-Si (KR)

(73) Assignee: Samsung Electronics Co., Ltd. (KR)

( * ) Notice: Subject to any disclaimer, the term of this patent is extended or adjusted under 35 U.S.C. 154(b) by 923 days.

(21) Appl. No.: 11/447,328

(22) Filed: Jun. 6, 2006

(65) Prior Publication Data
US 2007/0128808 A1 Jun. 7, 2007

(30) Foreign Application Priority Data
Dec. 1, 2005 (KR) .................. 10-2005-0116320
Mar. 30, 2006 (KR) .................. 10-2006-0028875

(51) Int. Cl.
*H01L 21/20* (2006.01)
(52) U.S. Cl. ........... 438/478; 257/E29.07; 257/E29.245; 257/E21.404
(58) Field of Classification Search .............. 438/478; 257/E29.07, E29.245, E21.404
See application file for complete search history.

(56) References Cited

U.S. PATENT DOCUMENTS

| | | | |
|---|---|---|---|
| 4,731,213 A * | 3/1988 | Klepsch | 264/512 |
| 6,139,626 A | 10/2000 | Norris et al. | 117/68 |
| 6,478,994 B1 | 11/2002 | Sneddon et al. | |
| 6,525,461 B1 | 2/2003 | Iwasaki et al. | 313/495 |
| 2002/0104762 A1 * | 8/2002 | Stonas et al. | 205/118 |
| 2003/0010971 A1 * | 1/2003 | Zhang et al. | 257/15 |
| 2003/0185985 A1 | 10/2003 | Bronikowski et al. | |
| 2004/0201042 A1 | 10/2004 | Den et al. | |
| 2005/0204920 A1 * | 9/2005 | Hong et al. | 96/4 |
| 2005/0214661 A1 * | 9/2005 | Stasiak et al. | 430/22 |
| 2006/0204145 A1 * | 9/2006 | Vasic et al. | 382/321 |

FOREIGN PATENT DOCUMENTS
WO 2004/055912 7/2004

OTHER PUBLICATIONS

Anselm, Alex "An Introduction to MBE Growth," University of Texas Austin website http://projects.ce.utexas.edu/ece/mrc/groups/street_mbe/mbechapter.html, 1997.*
Extended European Search Report; Dated Jun. 22, 2009; Application No. 06254792.2.
K. Shantha Shankar, et al., Fabrication of nanowires of multicomponent oxides: Review of recent advances, Materials Science and Engineering C 25 (2005) pp. 738-751.

* cited by examiner

Primary Examiner — Evan Pert
Assistant Examiner — Matthew Reames
(74) Attorney, Agent, or Firm — Cantor Colburn LLP

(57) ABSTRACT

Disclosed herein is a method for producing nanowires. The method comprises the steps of providing a porous template with a plurality of holes in the form of tubes, filling the tubes with nanoparticles or nanoparticle precursors, and forming the filled nanoparticles or nanoparticle precursors into nanowires. According to the method, highly rectilinear and well-ordered nanowires can be produced in a simple manner.

20 Claims, 5 Drawing Sheets

(a)

(b)

(c)

METHOD FOR PRODUCING NANOWIRES USING A POROUS TEMPLATE

BACKGROUND OF THE INVENTION

This non-provisional application claims priority under 35 U.S.C. §119(a) to Korean Patent Application No. 2005-116320 filed on Dec. 1, 2005 and to Korean Patent Application No. 2006-28875 filed on Mar. 30, 2006, both of which are hereby incorporated in their entirety by reference.

FIELD OF THE INVENTION

The present invention relates to a method for producing nanowires using a porous template that comprises tubes. Each tube has an associated hole for producing nanowire structures. More specifically, the present invention relates to a method for producing highly rectilinear and well-ordered nanowires by using a porous template having a plurality of holes that serve as an opening to a long tube and filling the tubes with nanoparticles or nanoparticle precursors thereby converting the filled nanoparticles or nanoparticle precursors into nanowires.

DESCRIPTION OF THE RELATED ART

Nanowires are linear materials whose diameter is in the nanometer range (1 nm=$10^{-9}$ m) and whose length is much larger than the diameter. Nanowires have a length of several hundred nanometers or on the order of micrometers (1 µm=$10^{-6}$ m) or millimeters (1 mm=$10^{-3}$ m). Nanowires exhibit physical properties that are dependent upon their diameter and length.

Nanowires can be used to fabricate a variety of microdevices because of their small size. The inherent electron mobility characteristics of nanowires along specific directions can be advantageously used in a variety of devices. In addition, they can be advantageously used for their optical properties, such as polarization.

Nanowires can be used in nanoelectronic devices, such as single electron transistors (SETs. In addition, nanowires can be used as optical waveguides and nano-analyzers using the characteristics of surface plasmon polarization. The nanowires can be used in highly sensitive signal detectors for cancer diagnosis.

Extensive research on the production and physical properties of nanoparticles is now being actively undertaken, but few studies on common production methods of nanowires have been reported. Representative methods for producing nanowires include template approaches, chemical vapor deposition (CVD), laser ablation, and the like.

According to template approach, holes having a size of several hundred nanometers are used as frames to produce nanowires. First, an aluminum electrode is oxidized to form aluminum oxide on the surface of the electrode, and then the porous aluminum oxide is electrochemically etched to produce a template having nanoholes. The template is dipped in a solution containing metal ions. When electricity is applied to the solution, the metal ions accumulate on the aluminum electrode through the holes as a result of which the holes are filled with the metal ions. Thereafter, the oxide is removed via an appropriate treatment to leave metal nanowires behind.

However, since the template approach is too complicated and time-consuming to implement, it is unsuitable for mass production of nanowires. Further, highly rectilinear and well-ordered nanowires cannot be produced by the template approach.

Specifically, a process for producing nanowires using a template is disclosed in U.S. Pat. No. 6,525,461. According to this process, titanium nanowires are produced by forming a catalyst film on an opaque substrate, forming a porous layer having holes thereon, followed by heat treatment to form the nanowires within the holes. The use of an opaque substrate prevents usage for photonic applications. Another method for forming quantum dot solids using a template is described in U.S. Pat. No. 6,139,626. According to this method, a quantum dot solid is formed by filling holes formed within the template with colloidal nanocrystals, followed by sintering. The conventional method thus uses a template having holes in the form of lattices. As explained above, most of the conventional methods for producing nanowires are not suitable for mass production of nanowires having superior physical properties at low cost. Thus, there is a need to develop a method for producing highly rectilinear and well-ordered nanowires at low cost.

SUMMARY OF THE INVENTION

The present invention satisfies some of the above-mentioned technical needs, and it provides a method for producing highly rectilinear and well-ordered nanowires by providing a porous template having holes in the form of long tubes, filling the tubes with nanoparticles or nanoparticle precursors, and forming the filled tubes into nanowires, thereby facilitating control of the diameter and length of the nanowires.

It also provides a nanowire structure with various functionalities whose characteristics are easily controllable and that is manufactured in a simple manner as compared with nanowires described above.

The present invention also provides a device with superior characteristics that is fabricated at low costs by the method disclosed herein.

In accordance with one aspect of the present invention there is provided a method for producing nanowires, the method comprising the steps of:

(a) providing a porous template with a plurality of holes that serve as entrances for long tubes that are used as templates for producing the nanowires;

(b) filling the tubes with nanoparticles or nanoparticle precursors; and (c) forming the filled nanoparticles or nanoparticle precursors in the tubes into nanowires.

In accordance with another aspect of the present invention, there is provided a nanowire structure comprising a porous template, formed within a matrix, with a plurality of holes in the form of tubes with nanowires formed within the tubes wherein the respective nanowires have different sizes and/or shapes.

The nanowires, formed within the tubes of the porous template, having different sizes and shapes may additionally have different compositions. In addition, the nanoparticles or nanoparticle precursors may have different physicochemical properties (e.g., dielectric constant, refractive index, and electrical conductivity).

In accordance with yet another aspect of the present invention, there is provided an electronic or optical device comprising nanowires produced by the method.

BRIEF DESCRIPTION OF THE DRAWINGS

The above features and other advantages of the present invention will be more clearly understood from the following detailed description taken in conjunction with the accompanying drawings, in which.

DESCRIPTION OF THE PREFERRED EMBODIMENTS

Hereinafter, the present invention will be explained in more detail with reference to the accompanying drawings.

Figure 1:
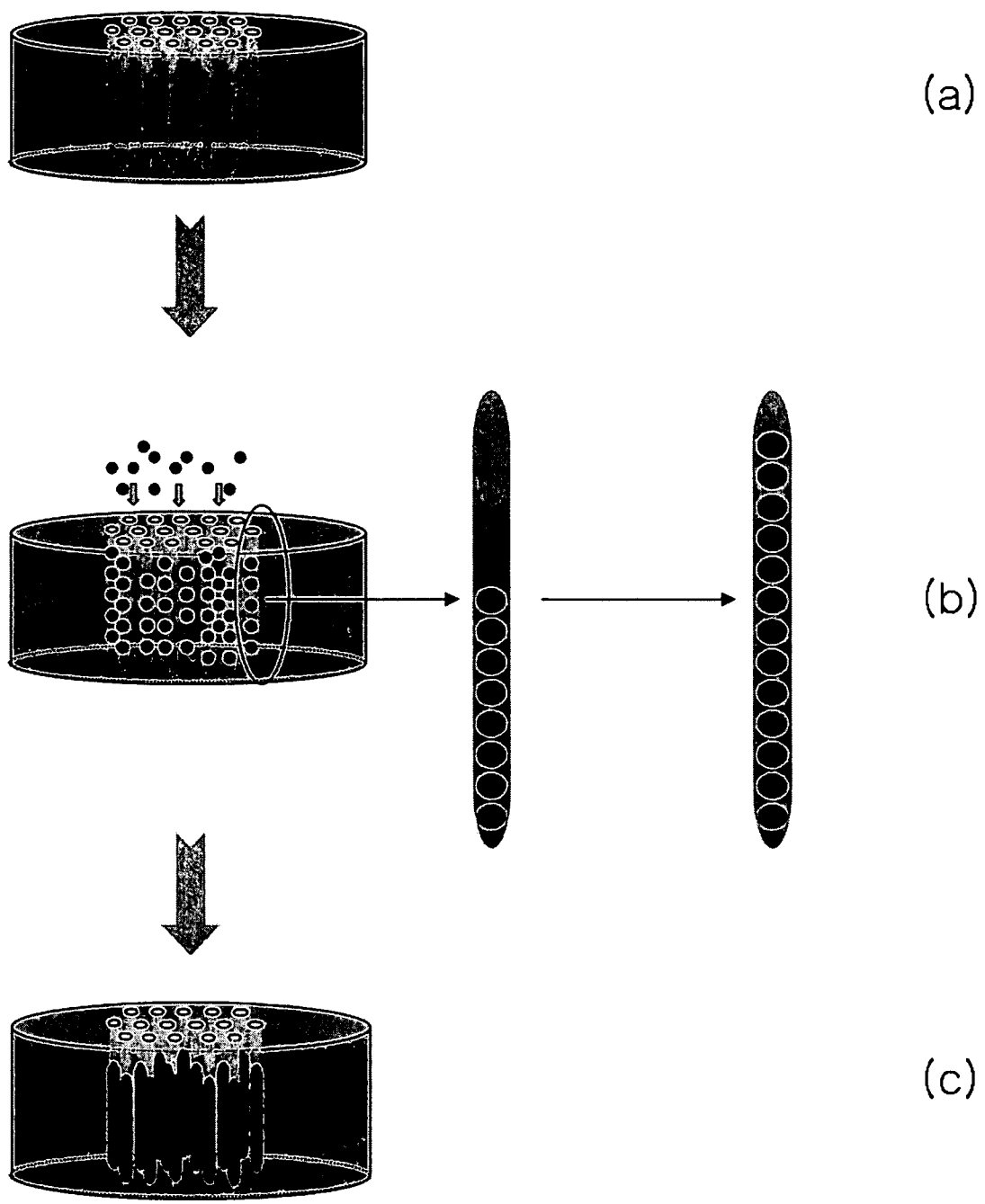
FIG. 1 schematically shows the principle of a method for producing nanowires using a porous template according to one embodiment of the present invention.

FIG. 1 schematically shows the principle of the method for producing nanowires using a porous template according to one embodiment of the present invention. According to the method of the present invention, a porous template is used in the production of nanowires. The template has a plurality of holes that serve as entrances for long tubes, which are formed preferably in the lengthwise direction of the template. First, a porous template is prepared (step a). Thereafter, tubes present in the porous template are filled with nanoparticles or nanoparticle precursors (step b). After completion of the filling, annealing is performed to convert the nanoparticles or nanoparticle precursors into nanowires (step c).

According to the method of the present invention, since the control over the diameter of the tubes present in the porous template is easily achieved, the diameter and length of the nanowires can be readily controlled. In addition, the nanowires can be formed to have a superlattice or hybrid structure by varying the kind or composition of materials used for the preparation of the nanowires. Furthermore, the peripheral surface of the nanowires can be doped with a dopant.

Hereinafter, the method of the present invention will be explained in more detail, based on the respective steps.

(a) Provision of Porous Template

Figure 2:
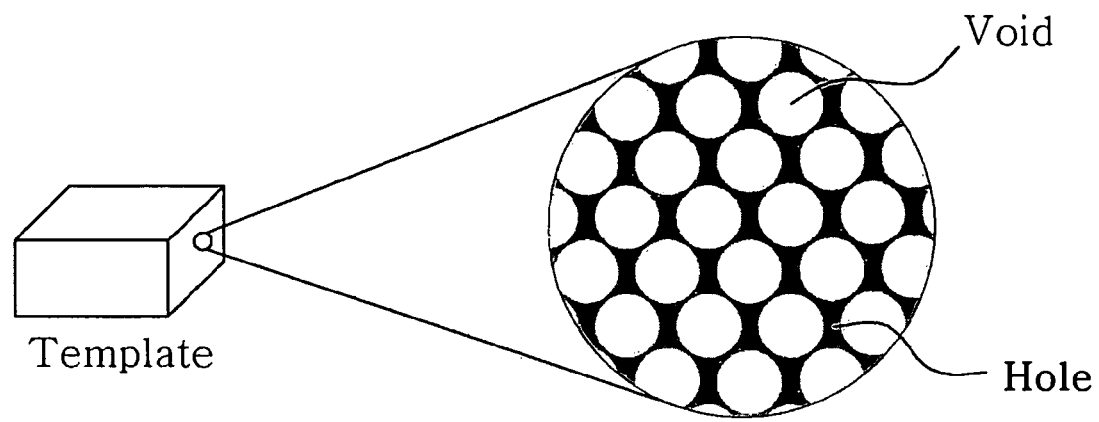
FIG. 2 is a schematic diagram showing the structure of a porous template used in a conventional method for producing nanowires.

The method of the present invention is characterized by the use of a porous template having a plurality of holes in the form of long tubes. That is, the plurality of holes contained in the template serve as entrances to tubes whose diameters are in general greater than their lengths. U.S. Pat. No. 6,139,626 introduces a method for forming a quantum dot solid by providing a porous template having holes and filling the holes with nanoparticles. The structure of the porous template used in the conventional method described in U.S. Pat. No. 6,139,626 (see, FIG. 2) is clearly distinguished from that of the porous template used in the method of the present invention.

Holes formed within the template used in the conventional method are not in the form of tubes, and instead, voids are formed of silica ($SiO_2$) in the form of lattices within the template. Accordingly, when nanoparticles are filled into the holes in the form of lattices, a non-uniform radial distribution is obtained. Although the holes are formed in a continuous configuration, they cannot be formed into wires. Accordingly, even after nanoparticles are filled into the holes and sintered, the final product (i.e. quantum dot solid) has an irregular shape.

In contrast, according to the method of the present invention, since nanoparticles are filled into holes in the form of tubes formed within the template, the final nanowires are highly regular and well-ordered. Particularly, since the size and length of the porous template and the spacing between holes of the template can be appropriately varied during the manufacture of the template, nanowires suitable for a desired application can be produced.

The template used in the method of the present invention can be made of a material selected from the group consisting of glass, silica, and metal oxides, such as $TiO_2$, ZnO, $SnO_2$ and $WO_3$. The porous template may be embedded within a matrix formed of a metal oxide or a polymer. In one embodiment, the porous template is optically transparent and can be advantageously used for manufacturing optical devices.

Preferably, holes in the form of wires can be formed in the lengthwise direction of the template using the material for the template, in accordance with the following procedure.

The template is basically manufactured by preparing a template preform and extracting a template form from the template preform. The formation of holes and the associated tubes is determined by the extraction speed and cooling conditions. Particularly, by previously processing the desired shape of holes, a structure in which the initial shape is reduced to a nanometer scale can be attained by extraction.

Since the diameter and height of the porous template have a high degree of freedom, they can be selected according to the size of a substrate on which nanowires are grown. It is preferred that the template have a diameter of about 1 nm (nanometer) to about 1 mm (millimeter) and a height of about 100 nm to about 1 mm. Depending on the size of the substrate, two or more templates may be used. The diameter and spacing of the holes formed within the porous template can be varied depending upon the specification of the final nanowires. It is preferred that the holes have a diameter of about 1 to about 100 nm and a spacing of about 2 nm to about 1 μm (micrometer).

Furthermore, while the size and/or shape of the holes and their associated tubes formed within the porous template can be controlled, the compositions of nanoparticles or nanoparticle precursors filled into the respective tubes can be varied to produce multifunctional nanowires or nanowires/template complexes. Further, materials having different physiochemical properties (e.g., dielectric constant, refractive index and electrical conductivity) can be used in nanoparticle form or nanoparticle precursor form for manufacturing the nanowires.

(b) Filling the Holes of the Associated Tubes with Nanoparticles or Nanoparticle Precursors In this step, a dispersion of nanoparticles in an appropriate solvent, e.g., toluene, is disposed into the tubes via the holes. Because the holes are formed on a nanometer scale, the filling is preferably performed by maintaining both ends of the template at different temperatures or pressures or by applying an electric field or mechanical force to the template.

Alternatively, nanoparticle precursors can be added to a suitable solvent and filled into the tubes via the holes to form nanoparticles. In one embodiment, a mixture of a metal precursor and a chalcogenide precursor can be used to create the nanowire. In another embodiment, a single precursor can be used as the nanoparticle precursor for manufacturing the nanowires. Specific examples of suitable metal precursors include cadmium chloride ($CdCl_2$), cadmium acetate (Cd($CH_3COO)_2$), cadmium oxide (CdO), dimethyl cadmium ($CdMe_2$, Me=$CH_3$), zinc chloride ($ZnCl_2$), zinc acetate (Zn($CH_3COO)_2$), dimethyl zinc ($ZnMe_2$, Me=$CH_3$), lead chloride ($PbCl_2$), and lead acetate (Pb($CH_3COO)_2$). Combinations of the metal precursors may be used if desired.

Specific examples of suitable chalcogenide precursors include selenium (element) in a trioctylphosphine (TOP) solution, selenious acid ($H_2SeO_3$), bis(trimethylsilyl) selenium (($TMS)_2Se$), bis(trimethylsilyl) sulfur (($TMS)_2S$), thiourea ($NH_2CSNH_2$), thioacetamide ($CH_3CSNH_2$), sodium tellurate ($Na_2TeO_4$), bis(tert-butyl(dimethylsilyl) tellurium (($BDMS)_2Te$), and NaHTe. Combinations of the chalcogenide precursors may be used if desired.

Specific examples of suitable single precursors include precursors including CdS as a basic structure (when the nanoparticle precursor is CdS), e.g., $[Cd(S_2CNEt_2)_2]_2$, $[NpCdS_2CNEt_2]_2$ (Np=neo-pentyl), and $[MeCdS_2CNEt_2]_2$ (Me=methyl); and precursors including CdSe as a basic structure (when the nanoparticle precursor is CdSe), e.g., $[Cd(Se_2CNEt_2)_2]_2$, $[NpCdSe_2CNEt_2]_2$ (Np=neo-pentyl), and $[MeCdSe_2CNEt_2]_2$ (Me=methyl), all of which are found in Trindade et al. Chem. Mater. 9, 523, 1997.

Examples of solvents suitable for the dissolution of the nanoparticle precursors include $C_{6-22}$ alkyl phosphines, $C_{6-22}$ alkyl phosphine oxides, $C_{6-22}$ alkyl amines, and mixtures thereof.

Figure 3:
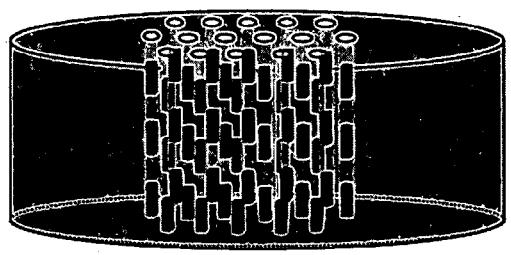
FIG. 3 is a schematic diagram showing hybrid nanowires produced by a method according to one embodiment of the present invention.
Figure 4:
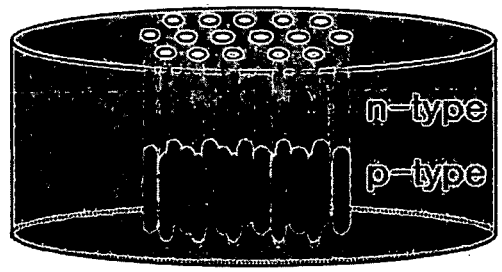
FIG. 4 is a schematic diagram showing doped nanowires produced by a method according to another embodiment of the present invention.

The nanoparticles or nanoparticle precursors may be sequentially or simultaneously filled at different concentrations to form a superlattice or hybrid structure. As shown in FIG. 3, different kinds of nanoparticles can be alternately filled into the tubes via the associated holes present in the porous template to produce hybrid nanowires. Alternatively, the nanoparticles or the nanoparticle precursors can be doped with a dopant to produce doped nanowires.

Examples of the nanoparticles used in the present invention include Group II-VI, Group III-V, Group IV-VI and Group IV compound semiconductor particles, metal particles, and magnetic particles. Preferred nanoparticles are nanoparticles of CdS, CdSe, CdTe, ZnS, ZnSe, ZnTe, GaN, GaP, GaAs, GaSb, AlN, AlP, AlAs, AlSb, InP, InAs, InSb, SiC, Fe, Pt, Ni, Co, Al, Ag, Au, Cu, FePt, $Fe_2O_3$, $Fe_3O_4$, Si, and Ge, or a combination comprising at least one of the foregoing nanoparticles. Core-shell structured alloy nanoparticles (or quantum dots) may be used in the present invention.

(C) Formation of Nanowires

After completion of the filling of the nanoparticles or nanoparticle precursors into the tubes of the porous template, the resulting structure is subjected to annealing, electrical resistance heating, mechanical pressurization, and the like to form nanowires. In doing so, the filled nanoparticles are heated above their melting point to connect to each other, thus forming a wire structure.

Specifically, the annealing can be performed at about 100° C. or higher for one minute. In one embodiment, the nanowires produced by the method of the present invention may be carbon nanotubes.

When it is intended to use the nanowires only, the template can be removed. Selective removal of the template can be achieved by chemical processing using an etchant, e.g., hydrofluoric acid.

In another aspect, the present invention is directed to a nanowire structure comprising a porous template, formed within a matrix, with a plurality of holes in the form of tubes and nanowires formed within the tubes wherein the respective nanowires have different sizes and/or shapes. That is, since various factors, such as size, shape, arrangement and composition, of the nanowires can be controlled in various manners, the nanowire structure of the present invention may have a variety of functionalities.

The nanowires formed within the different tubes may have different compositions and physiochemical properties, such as different dielectric constants, refractive index and/or electrical conductivities. For example, some nanowires may be formed of a semiconductor material and some nanowires may be formed of a metal. In addition, the nanowires may have a structure wherein different compositions are alternated in the lengthwise direction of the template. Alternatively, the nanowires may be doped.

Figure 5A:
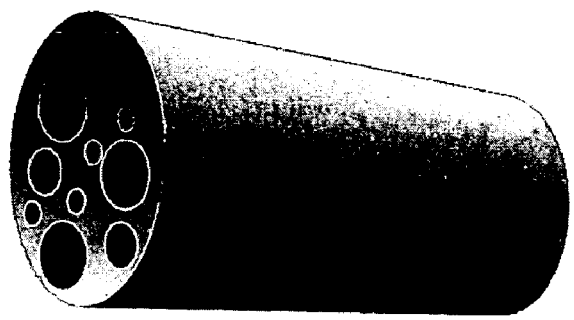
FIG. 5a is a cross-sectional perspective view of a nanowire structure comprising nanowires with different diameters according to the present invention.
Figure 5B:
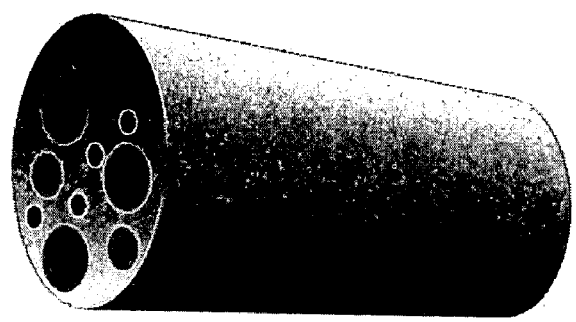
FIG. 5b is a cross-sectional perspective view of a nanowire structure comprising nanowires with different diameters and compositions according to the present invention.

Various nanowire structures according to embodiments of the present invention are exemplified in FIGS. 5a to 5e. FIG. 5a is a cross-sectional perspective view of a nanowire structure comprising nanowires with different diameters, and FIG. 5b is a cross-sectional perspective view of a nanowire structure comprising nanowires with different diameters and compositions. In the case where the nanowire structure of the present invention is used to constitute a light-emitting device, colors emitted due to the quantum confinement effects can be controlled by varying the diameter of the nanowires.

Figure 5C:
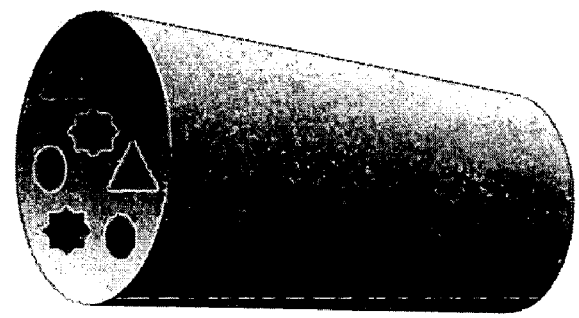
FIG. 5c is a cross-sectional perspective view of a nanowire structure comprising nanowires with different cross-sectional shapes according to the present invention.
Figure 5D:
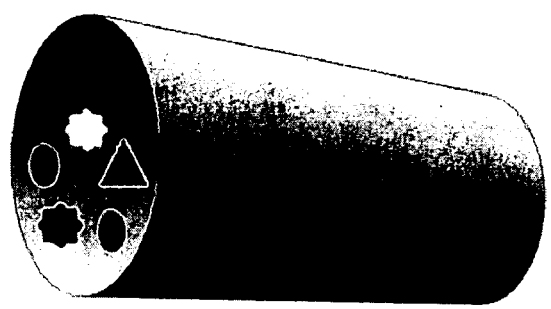
FIG. 5d is a cross-sectional perspective view of a nanowire structure comprising nanowires with different cross-sectional shapes and compositions according to the present invention.
Figure 5E:
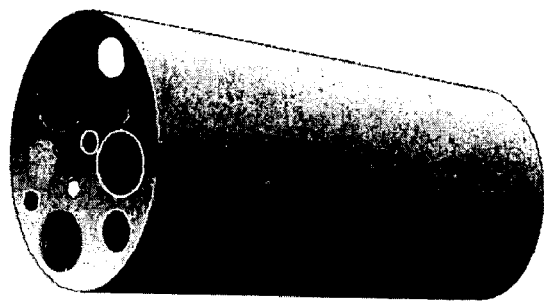
FIG. 5e is a cross-sectional perspective view of a nanowire structure comprising nanowires with different diameters and compositions and a matrix with different compositions according to the present invention.

FIG. 5c is a cross-sectional perspective view of a nanowire structure comprising nanowires with different cross-sectional shapes, and FIG. 5d is a cross-sectional perspective view of a nanowire structure comprising nanowires with different cross-sectional shapes and compositions. According to the nanowire structure of the present invention, the cross-sectional shape of the nanowires can be easily controlled by varying the shape of the template. The respective nanowires may have different compositions and physiochemical properties, such as dielectric constant, refractive index and electrical conductivity. As shown in FIG. 5e, the diameter and composition of nanowires can be varied. In addition, the composition of the porous template can be changed from $SiO_2$ to an insulating polymer.

In yet another aspect, the present invention is directed to a device comprising highly rectilinear and well-ordered nanowires produced by the present method. The device may be an electronic or optical device. Examples of the device include electronic devices, such as field effect transistors (FETs), sensors, photodetectors, light-emitting diodes (LEDs), laser diodes (LDs), electroluminescence (EL) devices, photoluminescence (PL) devices, and cathode luminescence (CL) devices.

Reference will now be made in greater detail to an EL device.

Figure 6:
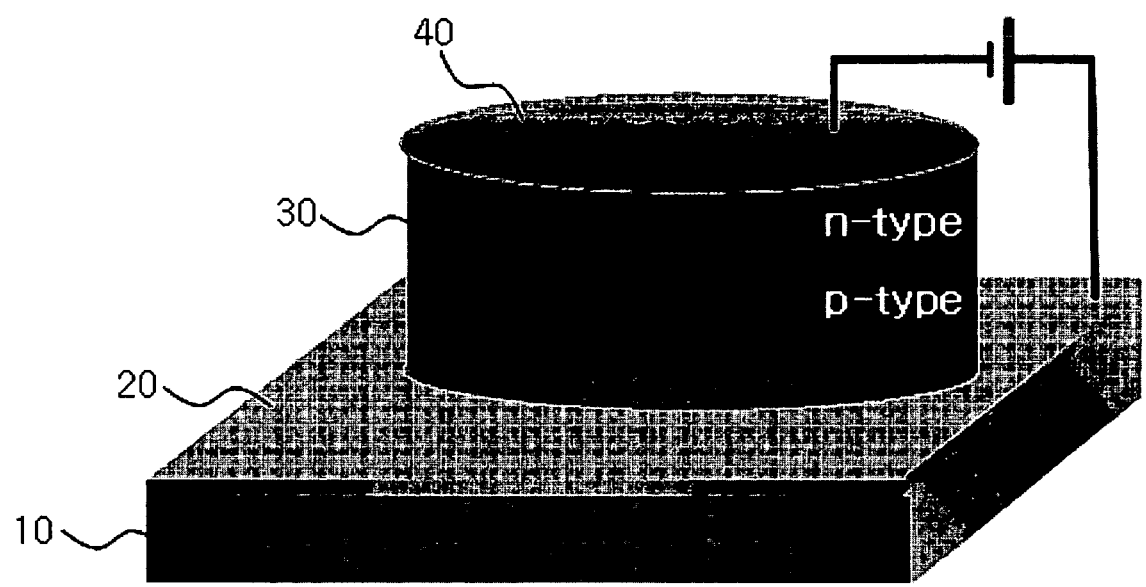
FIG. 6 is a schematic diagram showing the structure of an EL (electroluminescent) device according to one embodiment of the present invention.

FIG. 6 is a schematic diagram showing the structure of an EL device according to one embodiment of the present invention. Referring to FIG. 6, the EL device comprises a substrate 10, a first electrode layer 20, nanowires 30 formed inside tubes of the porous template embedded within the matrix, and a second electrode layer 40 formed sequentially from the bottom.

According to an EL device using nanowires produced by a common method, it is difficult to achieve sufficient rectilinear properties of the nanowires. In addition, since electrodes are formed by filling other materials between the nanowires, the procedure is complicated. In contrast, the EL device using nanowires produced by the method of the present invention comprises a transparent template in the visible wavelength range, electrodes are easily formed immediately after production of the nanowires. Accordingly, the light-emitting device can be fabricated in an economical and simple manner.

Nanowires can emit light at different wavelengths depending on their diameter or composition. For example, ZnO nanowires emit UV light, Si nanowires emit infrared light, GaN nanowires emit UV or blue light, and InGaN nanowires emit blue light. Nanoparticles having a band gap in the visible wavelength range can be used to fabricate a visible light-emitting device, and nanoparticles having a band gap in the UV region can be used to fabricate a UV light-emitting device Specifically, the nanowires 30 can be p-doped, n-doped, or p-n doped so as to have diode characteristics. At this time, a p-type dopant having a high electrical affinity is adsorbed onto the peripheral surface of the nanowires to form p-doped portions of the nanowires, and an n-type dopant having a low ionization potential is adsorbed onto the peripheral surface of the nanowires to form the n-doped portions of the nanowires.

The substrate 10, the first electrode layer 20, and the second electrode layer 40 can be formed of materials commonly used for EL devices in accordance with general procedures.

Hereinafter, the present invention will be explained in more detail with reference to the following examples. However, these examples are given for the purpose of illustration and are not to be construed as limiting the scope of the invention.

Example 1

Production of Nanowires

A porous template having a size of 100 µm was placed on a substrate, and then a dispersion of CdSe nanoparticles in toluene was sprayed on the surface of the template. The template had holes (diameter: 20 nm, spacing: 40 nm, length: 1 µm) in the form of wires therein. A relatively low pressure was applied to the lower side of the template for a very short time to fill the holes with the nanoparticles. After completion of the filling, the resulting structure was annealed at 200° C. for 10 minutes to form nanowires.

Example 2

Fabrication of an EL Device

Nanowires were produced on top of an ITO-patterned glass substrate in the same manner as in Example 1, and then an electrode was formed by photolithography. Titanium (Ti) was deposited to a thickness of 20 nm on the nanowire layer, and gold was deposited to a thickness of 100 nm thereon to form a second electrode layer, completing the fabrication of an EL device.

As apparent from the foregoing, according to the method of the present invention, the diameter and length of nanowires can be freely controlled in a simple manner.

In addition, the size and shape of holes formed within a porous template and the composition of materials for nanowires can be controlled in a manner effective to produce multifunctional nanowires.

Nanowires produced by the method of the present invention can be effectively used in the fabrication of a variety of electronic and optical devices. The electronic devices using the nanowires have improved characteristics and can be fabricated at reduced costs.

Although the present invention has been described herein with reference to the foregoing specific examples, these examples do not serve to limit the scope of the present invention. Accordingly, those skilled in the art will appreciate that various modifications and changes are possible, without departing from the technical spirit of the present invention. For example, the method of the present invention can be applied to the production of carbon nanotubes, if desired.

What is claimed is:

1. A method for producing nanowires, comprising the steps of:
   (a) providing a porous template with a plurality of tubes, wherein each tube has an associated hole;
   (b) filling the tubes with nanoparticles or nanoparticle precursors; and
   (c) forming the filled nanoparticles or nanoparticle precursors into nanowires, wherein step (c) is carried out by heating the filled nanoparticles or nanoparticle precursors to above the melting point of the nanoparticles or nanoparticle precursors, via electrical resistance heating or mechanical pressurization, to form agglomerates of the nanoparticles or the nanoparticle precursors.

2. The method according to claim 1, wherein the metal oxide is selected from the group consisting of $TiO_2$, ZnO, $SnO_2$ and $WO_3$.

3. The method according to claim 1, wherein the porous template is embedded within a matrix formed of a metal oxide or an insulating polymer.

4. The method according to claim 1, wherein the porous template has a diameter of 1 nm to 1 mm and a height of 100 nm to 1 mm.

5. The method according to claim 1, wherein the holes of the respective tubes have a diameter of 1 to 100 nm and are spaced at a distance of 2 nm to 1 µm.

6. The method according to claim 1, wherein the porous template has a plurality of tubes with different shapes.

7. The method according to claim 1, wherein step (b) is carried out by dispersing nanoparticles or nanoparticle precursors in a solvent, and controlling a temperature or pressure at both ends of the template or applying an electric field or a mechanical force to the template.

8. The method according to claim 1, wherein step (a) is carried out by filling the tubes of the porous template with nanoparticles or nanoparticle precursors having different compositions.

9. The method according to claim 8, wherein step (a) is carried out by filling different tubes with nanoparticles or nanoparticle precursors having different dielectric constants, refractive indices or electrical conductivities.

10. The method according to claim 1, wherein step (a) is carried out by sequentially filling nanoparticles or nanoparticle precursors having different compositions.

11. The method according to claim 1, wherein the nanoparticles or nanoparticle precursors are filled together with a dopant and doped with the dopant.

12. The method according to claim 1, wherein the nanoparticles are selected from the group consisting of Group II-VI, Group III-V, Group IV-VI and Group IV compound semiconductor particles, metal particles, magnetic particles, and quantum dots.

13. The method according to claim 12, wherein the nanoparticles are selected from the group consisting of nanoparticles of CdS, CdSe, CdTe, ZnS, ZnSe, ZnTe, GaN, GaP, GaAs, GaSb, AlN, AlP, AlAs, AlSb, InP, InAs, InSb, SiC, Fe, Pt, Ni, Co, Al, Ag, Au, Cu, FePt, $Fe_2O_3$, $Fe_3O_4$, Si, Ge, and a combination comprising at least one of the foregoing nanoparticles.

14. The method according to claim 1, wherein the nanoparticles have a core-shell structure.

15. The method according to claim 1, wherein step (a) is carried out by separately adding a metal precursor and a chalcogenide precursor to react with each other.

16. The method according to claim 1, wherein step (a) is carried out by using a single precursor.

17. The method according to claim 1, further comprising heating the filled nanoparticles or nanoparticle precursors to above the melting point of the nanoparticles or nanoparticle precursors, via annealing.

18. The method according to claim 1, wherein the nanowires are carbon nanotubes.

19. The method according to claim 3, further comprising the step of removing the template formed within the matrix.

20. The method of claim 1, wherein the porous template is made of a material selected from the group consisting of glass, silica, and meal oxides.

* * * * *